(12) United States Patent
Ke et al.

(10) Patent No.: US 11,342,358 B2
(45) Date of Patent: May 24, 2022

(54) DISPLAY PANEL AND METHOD FOR MANUFACTURING SAME

(71) Applicant: WUHAN CHINA STAR OPTOELECTRONICS SEMICONDUCTOR DISPLAY TECHNOLOGY CO., LTD., Hubei (CN)

(72) Inventors: Linbo Ke, Hubei (CN); Bo Liang, Hubei (CN); Mengying Wu, Hubei (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 98 days.

(21) Appl. No.: 16/631,180

(22) PCT Filed: Sep. 24, 2019

(86) PCT No.: PCT/CN2019/107450
§ 371 (c)(1),
(2) Date: Jan. 15, 2020

(87) PCT Pub. No.: WO2021/003848
PCT Pub. Date: Jan. 14, 2021

(65) Prior Publication Data
US 2021/0013237 A1    Jan. 14, 2021

(30) Foreign Application Priority Data

Jul. 11, 2019 (CN) .......................... 201910624310.3

(51) Int. Cl.
*H01L 27/12* (2006.01)
*H01L 51/00* (2006.01)
(Continued)

(52) U.S. Cl.
CPC .... *H01L 27/1218* (2013.01); *G02F 1/133305* (2013.01); *H01L 27/1266* (2013.01);
(Continued)

(58) Field of Classification Search
CPC ............. H01L 27/1218; H01L 51/5253; H01L 51/0097; H01L 27/1266; H01L 2251/5338;
(Continued)

(56) References Cited

U.S. PATENT DOCUMENTS

2013/0169515 A1    7/2013  Prushinskiy et al.
2016/0014883 A1    1/2016  Cho et al.
(Continued)

FOREIGN PATENT DOCUMENTS

CN    106684243 A    5/2017
CN    107068862 A    8/2017
(Continued)

*Primary Examiner* — Kyoung Lee
(74) *Attorney, Agent, or Firm* — Mark M. Friedman

(57) ABSTRACT

A display panel and a method for manufacturing the display panel are provided. The display panel includes a planar region and a bending region. The display panel includes a flexible substrate and a driving circuit layer. The flexible substrate at least includes a first flexible layer, a barrier layer and a second flexible layer. The driving circuit layer is disposed at a side of the second flexible layer away from the barrier layer. In the bending region, a groove is disposed at a side of the first flexible layer away from the barrier layer. The technical problem of stress concentration in the bending region is alleviated by disposing the groove.

18 Claims, 6 Drawing Sheets

(51) Int. Cl.
*H01L 51/52* (2006.01)
*G02F 1/1333* (2006.01)
*G02F 1/1368* (2006.01)
*H01L 27/32* (2006.01)

(52) U.S. Cl.
CPC ...... *H01L 51/0097* (2013.01); *H01L 51/5253* (2013.01); *G02F 1/1368* (2013.01); *H01L 27/3244* (2013.01); *H01L 2251/5338* (2013.01)

(58) Field of Classification Search
CPC ........... H01L 27/3244; G02F 1/133305; G02F 1/1368; G02F 1/1345; Y02E 10/549
See application file for complete search history.

(56) References Cited

U.S. PATENT DOCUMENTS

| | | | |
|---|---|---|---|
| 2018/0233682 A1 | 8/2018 | Lin et al. | |
| 2019/0109181 A1* | 4/2019 | Chung | ................ H01L 51/0031 |

FOREIGN PATENT DOCUMENTS

| | | |
|---|---|---|
| CN | 109148534 A | 1/2019 |
| CN | 109659318 A | 4/2019 |
| CN | 109786426 A | 5/2019 |
| WO | 2014137113 A1 | 9/2014 |

* cited by examiner

DISPLAY PANEL AND METHOD FOR MANUFACTURING SAME

CROSS-REFERENCE TO RELATED APPLICATIONS

This application is a U.S. national phase application of a PCT Application No. PCT/CN2019/107450 filed on Sep. 24, 2019, which claims priority to a Chinese Patent Application No. 201910624310.3 filed on Jul. 11, 2019, the disclosures of which are incorporated in their entirety by reference herein.

FIELD OF INVENTION

This disclosure relates to display technology, and more particularly, to a display panel and a method for manufacturing the display panel.

BACKGROUND OF INVENTION

With development of display technology, full-screen technology has become a main development trend. The design of bending a non-display area of a display panel to a back surface of a display area is an important method to realize a narrow border design of the display panel.

Conventional display panel generally comprises a flexible substrate to achieve a bending effect. However, after the flexible substrate is bent, metal wiring regions of a stress neutral layer and a driving circuit layer are often do not correspond with each other in a bending region. That causes the bending region to easily occur stress concentration and metal trace breakage.

Therefore, the conventional display panel has a technical problem that the stress neutral layer in the bending region and the metal wiring region of the driving circuit layer are not uniform, and it is needed to improve.

SUMMARY OF INVENTION

The disclosure provides a display panel and a method for manufacturing the display panel to solve the technical problem that metal wiring regions of a stress neutral layer and a driving circuit layer are often not corresponding with each other in a bending region in a conventional display panel.

In order to solve the above-mentioned drawbacks, the disclosure provides a technical solution as follow.

The disclosure provides a display panel. The display panel comprises a planar region and a bending region connected to the planar region, and a flexible substrate and a driving circuit layer. The flexible substrate at least comprises:

a first flexible layer;

a barrier layer disposed at a side of the first flexible layer;

a second flexible layer disposed at a side of the barrier layer away from the first flexible layer;

the driving circuit layer disposed at a side of the second flexible layer away from the barrier layer; and wherein a groove is disposed at a side of the first flexible layer away from the barrier layer in the bending region.

In the display panel of the disclosure, a cross-sectional shape of the groove is one of a trapezoidal shape, a semicircular shape, or a rectangular shape.

In the display panel of the disclosure, a number of the grooves is one or more.

In the display panel of the disclosure, the grooves are equally spaced between each other.

In the display panel of the disclosure, shapes of the grooves are the same.

In the display panel of the disclosure, shapes of the grooves are different.

In the display panel of the disclosure, a thickness of the groove is from one quarter to three quarters of a thickness of the first flexible layer.

In the display panel of the disclosure, the groove is disposed at an middle portion of the bending region.

In the display panel of the disclosure, the groove is disposed at a non-middle portion of the bending region.

In the display panel of the disclosure, the grooves are disposed at an middle portion and a non-middle portion of the bending region.

The disclosure further provides a method for manufacturing a display panel, The method comprises:

providing a substrate;

forming a transition layer on the substrate and patterning the transition layer to form a protrusion, wherein the display panel comprises a planar region and a bending region connected to the planar region, and the protrusion is formed in the bending region;

forming a flexible substrate at a side of the transition layer away from the substrate, wherein the flexible substrate at least comprises a first flexible layer formed on the transition layer, a barrier layer formed at a side of the first flexible layer away from the transition layer, and a second flexible layer formed at a side of the barrier layer away from the first flexible layer;

forming a driving circuit layer at a side of the second flexible layer away from the barrier layer; and peeling off the substrate and the transition layer.

In the method for manufacturing the display panel of the disclosure, the step of forming a transition layer on the substrate and patterning the transition layer to form a protrusion, wherein the display panel comprises a planar region and a bending region connected to the planar region, and the protrusion is formed in the bending region further comprises:

coating a transparent polymer material on the substrate to form the transition layer; and etching the transition layer to form the protrusion in the bending region.

In the method for manufacturing the display panel of the disclosure, the step of etching the transition layer to form the protrusion in the bending region further comprises: etching the transition layer to form the protrusion having a cross-sectional shape of one of a trapezoidal shape, a semicircular shape, or a rectangular shape.

In the method for manufacturing the display panel of the disclosure, the step of etching the transition layer to form the protrusion in the bending region further comprises: etching the transition layer to form one or more protrusions.

In the method for manufacturing the display panel of the disclosure, the step of etching the transition layer to form one or more protrusions further comprises: etching the transition layer to form a plurality of protrusions disposed at equal intervals on the transition layer.

In the method for manufacturing the display panel of the disclosure, the step of etching the transition layer to form one or more protrusions further comprises: etching the transition layer to form a plurality of protrusions having the same shape.

In the method for manufacturing the display panel of the disclosure, the step of etching the transition layer to form one or more protrusions further comprises: etching the transition layer to form a plurality of protrusions having different shapes.

In the method for manufacturing the display panel of the disclosure, the step of forming a flexible substrate at a side of the transition layer away from the substrate, wherein the flexible substrate at least comprises a first flexible layer formed on the transition layer, a barrier layer formed at a side of the first flexible layer away from the transition layer, and a second flexible layer formed at a side of the barrier layer away from the first flexible layer further comprises: forming a first flexible layer on the transition layer, and a height of the protrusion is from one quarter to three quarters of a thickness of the first flexible layer.

In the method for manufacturing the display panel of the disclosure, the step of forming a transition layer on the substrate and patterning the transition layer to form a protrusion, wherein the display panel comprises a planar region and a bending region connected to the planar region, and the protrusion is formed in the bending region further comprises: forming the protrusion in an middle portion of the bending region.

In the method for manufacturing the display panel of the disclosure, the step of forming a transition layer on the substrate and patterning the transition layer to form a protrusion, wherein the display panel comprises a planar region and a bending region connected to the planar region, and the protrusion is formed in the bending region further comprises: forming the protrusion in a non-middle portion of the bending region.

The technical effects are as follows. The disclosure provides a display panel and a method for manufacturing the display panel. The display panel comprises a planar region and a bending region connected to the planar region. The display panel further comprises a flexible substrate and a driving circuit layer. The flexible substrate at least comprises a first flexible layer, a barrier layer disposed at a side of the first flexible layer, and a second flexible layer disposed at a side of the barrier layer away from the first flexible layer. The driving circuit layer disposed at a side of the second flexible layer away from the barrier layer. Beside, a groove is disposed at a side of the first flexible layer away from the barrier layer in the bending region. By disposing the groove on the first flexible layer in the bending region, a thickness of the first flexible layer in the bending region is reduced, and then the stress neutral layer in the bending region gradually corresponds to the metal wiring region of the driving circuit layer. Therefore, the technical problem that metal wiring regions of a stress neutral layer and a driving circuit layer are often not corresponding with each other in a bending region in a conventional display panel can be improved.

DESCRIPTION OF DRAWINGS

In order to more clearly illustrate the embodiments of the present invention or the technical solutions in the prior art, the following briefly introduces the accompanying drawings used in the embodiments. Obviously, the drawings in the following description merely show some of the embodiments of the present invention. As regards one of ordinary skill in the art, other drawings can be obtained in accordance with these accompanying drawings without making creative efforts.

DETAILED DESCRIPTION OF PREFERRED EMBODIMENTS

Figure 1:
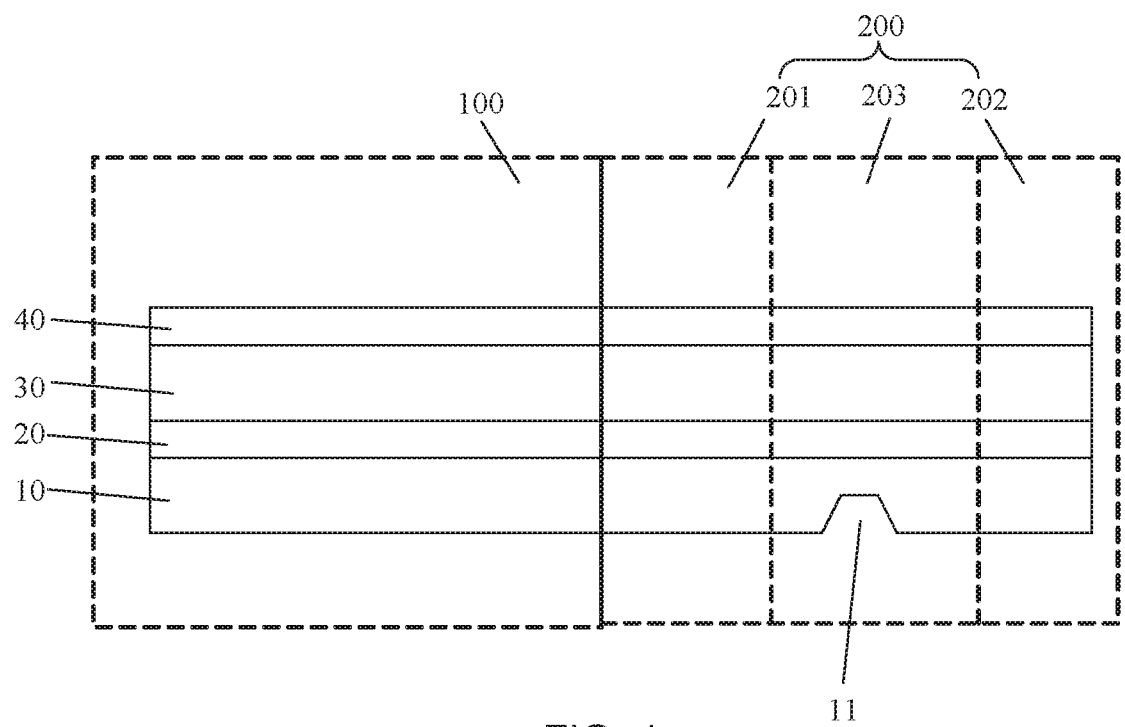
FIG. 1 is a schematic diagram of a first structure of a display panel according to an embodiment of the disclosure.

This description of the exemplary embodiments is intended to be read in connection with the accompanying drawings, which are to be considered part of the entire written description. In the description, terms such as "lower", "upper", "front", "behind", "left", "right", "inside", "outside", and "side", as well as derivatives thereof, should be construed to refer to the orientation as then described or as shown in the drawing under discussion. These terms are for convenience of description and do not require that the apparatus be constructed or operated in a particular orientation, and do not limit the scope of the disclosure. Referring to the drawings of the disclosure, similar elements are labeled with the same number.

The disclosure provides a display panel and a method for manufacturing the display panel to solve the technical problem that metal wiring regions of a stress neutral layer and a driving circuit layer are often not corresponding with each other in a bending region in a conventional display panel.

As shown in FIG. 1, a schematic diagram of a first structure of a display panel according to an embodiment of the disclosure is shown. The display panel includes a planar region 100 and a bending region 200 connected to the planar region 100. The display panel further includes a flexible substrate and a driver circuit layer 40, and the flexible substrate at least includes a first flexible layer 10, a barrier layer 20, and a second flexible layer 30.

Materials of the first flexible layer 10 and the second flexible layer 30 are usually polyimide, and are widely applied to flexible substrates because of their excellent heat resistance, radiation resistance, chemical resistance, electrical insulation, mechanical properties, and the like. Of course, the materials of the first flexible layer 10 and the second flexible layer 30 are not limited thereto, and may be other flexible materials. Thicknesses of the first flexible layer 10 and the second flexible layer 30 may or may not be equal.

The barrier layer 20 is disposed on one side of the first flexible layer 10, and is usually made of an inorganic material, such as a $SiO_2$ structure or a stacked structure of $SiO2$ and $SiNx$, etc., to function as a barrier to water and oxygen.

The second flexible layer 30 is disposed on a side of the barrier layer 20 away from the first flexible layer 10, and the driving circuit layer 40 is disposed on a side of the second flexible layer 30 away from the barrier layer 20. The driving circuit layer 40 includes a thin film transistor and metal traces.

It should be noted that the flexible substrate of the disclosure is not limited to the first flexible layer 10, the barrier layer 20, and the second flexible layer 30. The flexible substrate can be formed by coating a polyimide and depositing an inorganic material two or more times for forming more laminated layers of the flexible layers and the barrier layers. Those skilled in this field can design the number of layers of flexible substrates as needed.

In the embodiment of the disclosure, the display panel may be a liquid crystal display panel or an OLED display panel. Generally, a non-display area of the display panel is bent to a back surface of a display area to realize a narrow frame design of the display panel. Besides, the display area corresponds to the planar region 100, the non-display area corresponds to the bending region 200, and the bending region is only displays in the planar region 100.

When the display panel is an OLED display panel, in the planar region 100, the display panel further comprises a planarization layer disposed on the driving circuit layer 40, a pixel defining layer and a pixel electrode formed on the planarization layer, a luminescent functional layer formed on the pixel defining layer and the pixel electrode, and a common electrode formed on luminescent functional layer (not shown).

When the display panel is a liquid crystal display panel, in the planar region 100, the display panel further comprises a liquid crystal layer and a color filter substrate formed on the driving circuit layer 40.

In the bending region 200, a groove 11 is formed on a side of the first flexible layer 10 away from the barrier layer 20.

The bending region 200 includes a non-middle region and an middle region 203. The non-middle region includes a first bending region 201 connecting the planar region 100 and the middle region 203, and a second bending region 202 disposed at the other side of the middle region 203. There are various manners to set a position of the groove 11 in the bending region 200. In the present embodiment, the number of the grooves 11 is one and is formed in the middle region 203.

A cross-sectional shape of the groove 11 may be trapezoidal, rectangular, semi-circular, or the like, and may be other shapes. It should be noted that the cross-sectional shape of the groove 11 is a shape of the first flexible layer 10 under an unbent state.

In one embodiment, a thickness of the groove 11 is from one quarter to three quarters of a thickness of the first flexible layer 10. By adjusting the thickness of the groove 11, the thickness of the first flexible layer 10 in the bending region 200 can be controlled, thereby controlling a stress neutral layer to correspond to a metal trace when the display panel is bent.

When a material having a planar structure is bent, the material comprises a stress neutral layer. An element on a side of the stress neutral layer is compressed, and an element on the other side of the stress neutral layer is stretched. Elements disposed at the stress-neutral layer are neither subjected to tensile forces nor to compressive forces. A stress is almost zero, and lengths of the elements remain constant.

Figure 2:
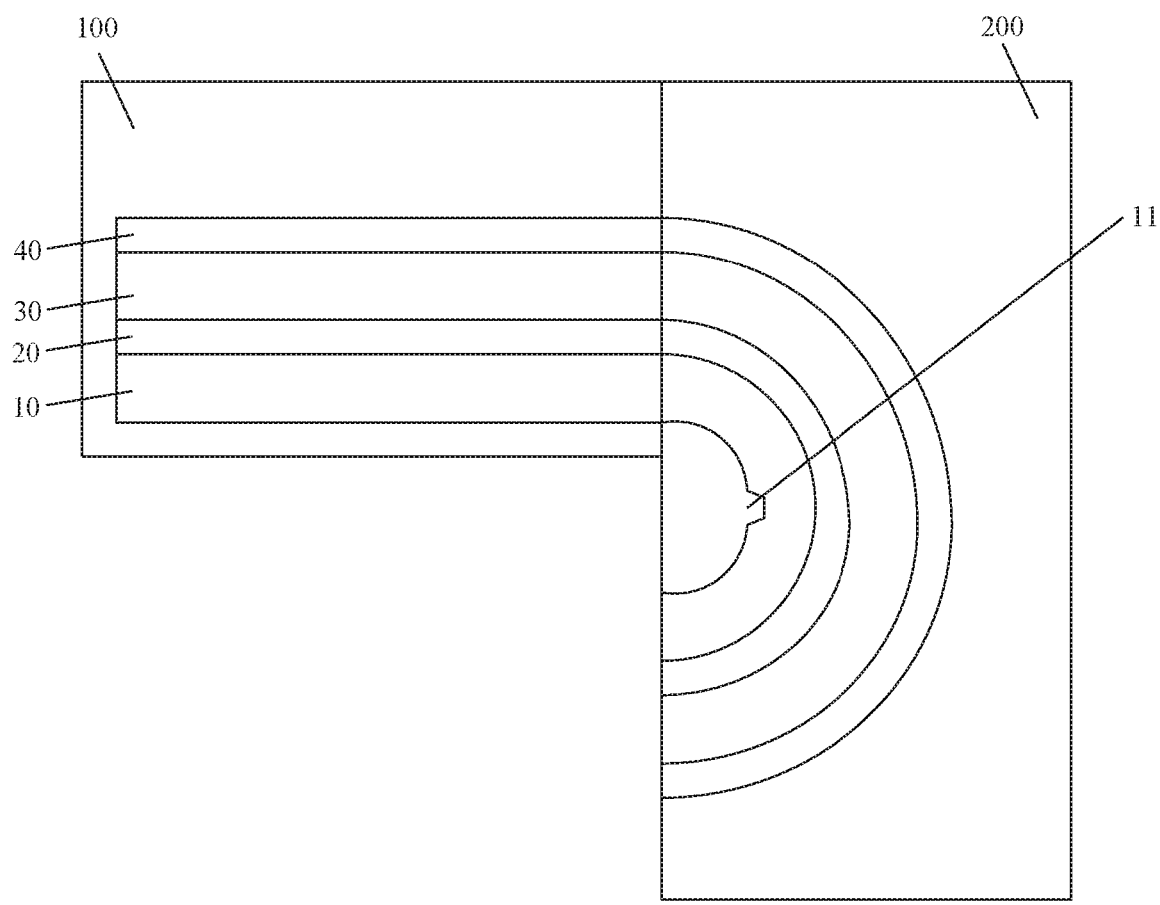
FIG. 2 is a bending schematic diagram of the first structure of the display panel according to an embodiment of the disclosure.

Referring to FIG. 2, a bending schematic diagram of a first structure of the display panel according to an embodiment of the disclosure is shown. When the display panel is bent, metal traces (not shown) in the drive circuit layer 40 are bent together. In the bending region 200, the metal traces are stressed. If the stress neutral layer of the display panel is aligned with the metal traces, a length of the metal traces will remain constant, and no damage such as breakage will occur. A display effect of the display panel will not be affected.

However, in the conventional technology, it is generally occurs that the stress neutral layer in the bending region 200 is inconsistent with the metal trace, and the metal trace is subjected to excessive stress and damage. By forming the groove 11 in the first flexible layer 10 in the bending region 200, a thickness of the first flexible layer 10 in the bending region 200 is reduced and then the stress neutral layer in the bending region 200 is aligned with the metal trace. The technical problems of stress concentration in the bending region and metal trace breakage can be improved.

Figure 3:
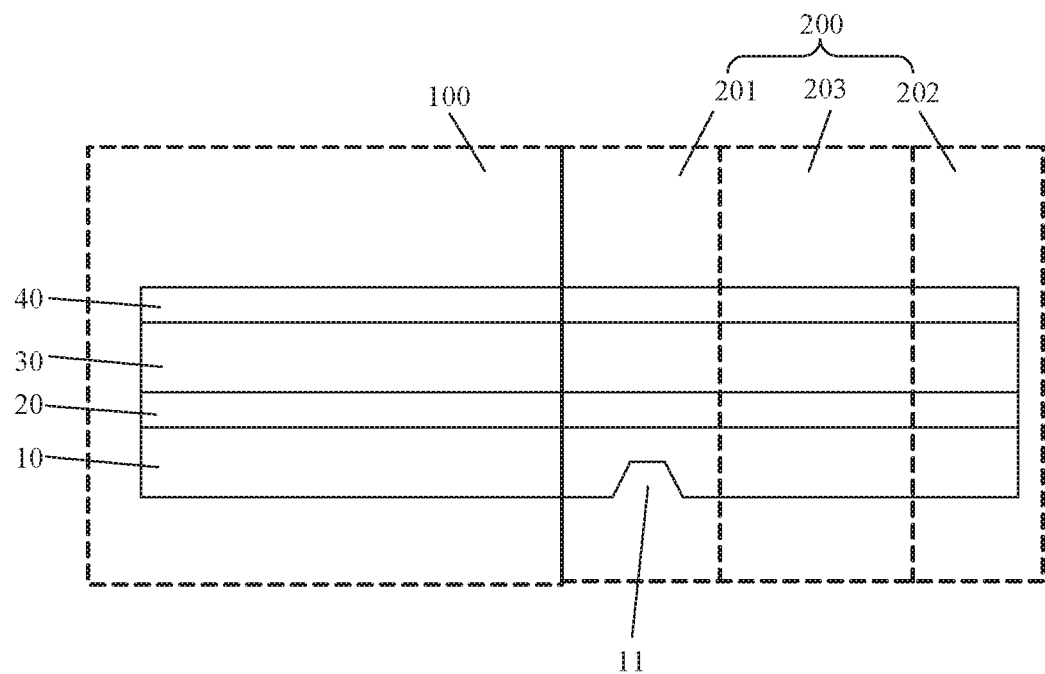
FIG. 3 is a schematic diagram of a second structure of a display panel according to an embodiment of the disclosure.

As shown in FIG. 3, a schematic diagram of a second structure of a display panel according to an embodiment of the disclosure is shown. The display panel includes a planar region 100 and a bending region 200 connected to the planar region 100. The display panel further includes a flexible substrate and a driver circuit layer 40, and the flexible substrate at least includes a first flexible layer 10, a barrier layer 20, and a second flexible layer 30.

In the present embodiment, the number of the grooves 11 is one and is formed in a non-middle region. The groove 11 may be formed in the first bending region 201 or may be formed in the second bending region 202.

A cross-sectional shape of the groove 11 may be trapezoidal, rectangular, semi-circular, or the like, and may be other shapes. It should be noted that the cross-sectional shape of the groove 11 is a shape of the first flexible layer 10 under an unbent state.

Figure 4:
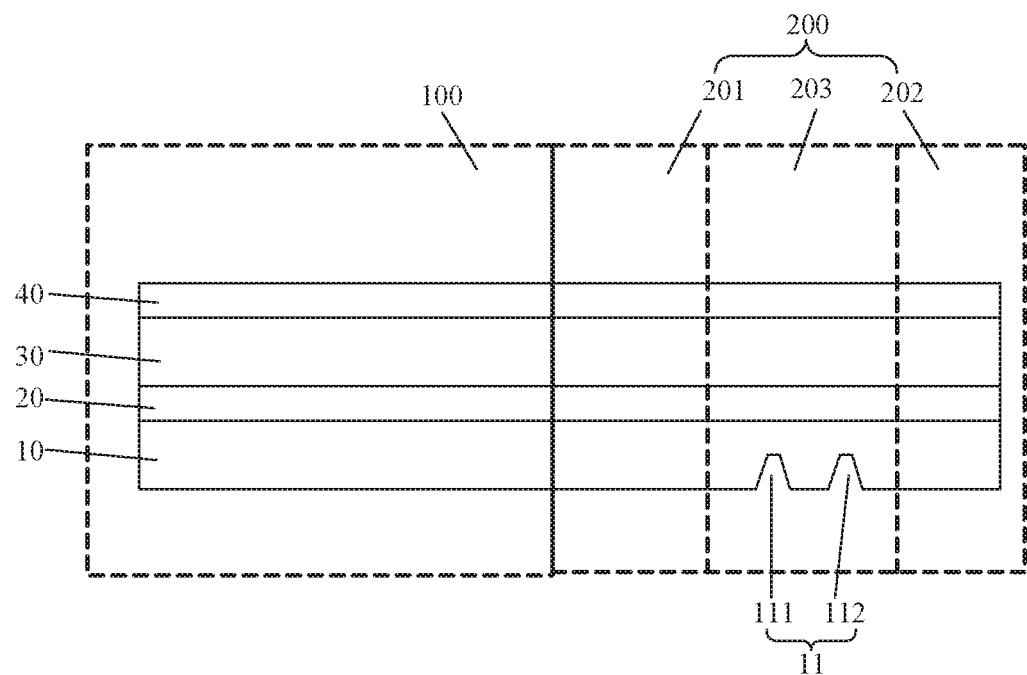
FIG. 4 is a schematic diagram of a third structure of a display panel according to an embodiment of the disclosure.

As shown in FIG. 4, a schematic diagram of a third structure of a display panel according to an embodiment of the disclosure is shown. The display panel includes a planar region 100 and a bending region 200 connected to the planar region 100. The display panel further includes a flexible substrate and a driver circuit layer 40, and the flexible substrate at least includes a first flexible layer 10, a barrier layer 20, and a second flexible layer 30.

In the present embodiment, the grooves 11 include a first groove 111 and a second groove 112, and both are formed in the middle region 203.

Cross-sectional shapes of the grooves 11 may be trapezoidal, rectangular, semi-circular, or the like, or may be other shapes, and the cross-sectional shapes of the first groove 111 and the second groove 112 may be the same or different. It should be noted that the cross-sectional shapes of the grooves 11 are shapes of the first flexible layer 10 under an unbent state.

Figure 5:
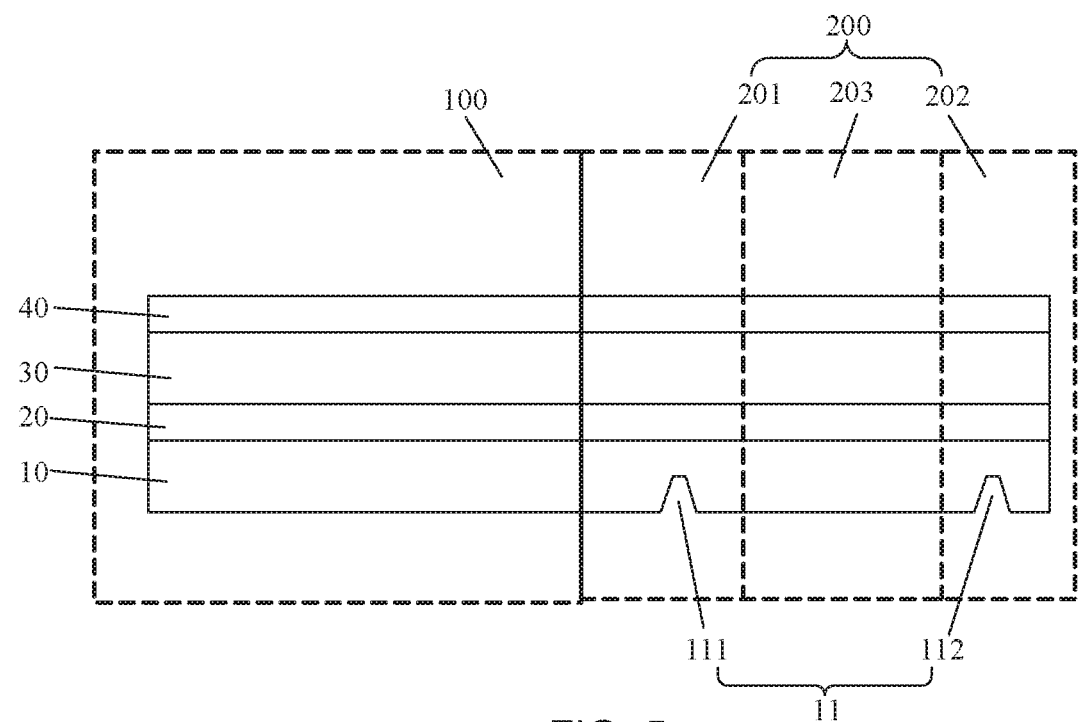
FIG. 5 is a schematic diagram of a fourth structure of a display panel according to an embodiment of the disclosure.

As shown in FIG. 5, a schematic diagram of a fourth structure of a display panel according to an embodiment of the disclosure is shown. The display panel includes a planar region 100 and a bending region 200 connected to the planar region 100. The display panel further includes a flexible substrate and a driver circuit layer 40, and the flexible substrate at least includes a first flexible layer 10, a barrier layer 20, and a second flexible layer 30.

In the present embodiment, the groove 11 includes a first groove 111 and a second groove 112, and both are formed in a non-middle region.

In one embodiment, the first groove 111 is disposed in the first bending region 201 and the second groove 112 is disposed in the second bending region 202.

In one embodiment, the first groove 111 and the second groove 112 are both disposed in the first bending region 201.

In one embodiment, the first groove 111 and the second groove 112 are both disposed in the second bending region 202.

Cross-sectional shapes of the grooves 11 may be trapezoidal, rectangular, semi-circular, or the like, or may be other shapes, and the cross-sectional shapes of the first groove 111 and the second groove 112 may be the same or different. It should be noted that the cross-sectional shapes of the grooves 11 are shapes of the first flexible layer 10 under an unbent state.

It should be noted that the number of the grooves 11 is not limited thereto. In the first bending region 201 or the second bending region 202, the number of the grooves 11 may be more than one, and the shapes of the plurality of grooves 11 may be the same. Alternatively, the plurality of grooves 11 may be equally spaced. Designers in the field can design the shape, size, spacing and other parameters of each groove 11 as required.

Figure 6:
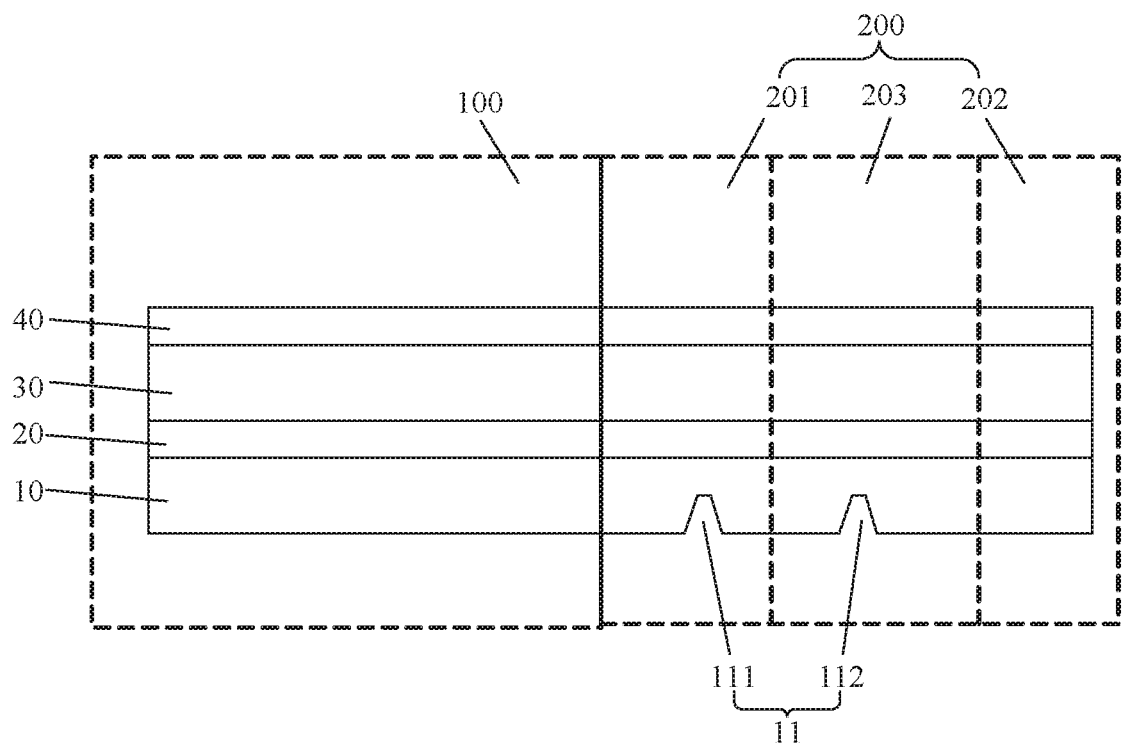
FIG. 6 is a schematic diagram of a fifth structure of a display panel according to an embodiment of the disclosure.

As shown in FIG. 6, a schematic diagram of a fifth structure of a display panel according to an embodiment of the disclosure is shown. The display panel includes a planar region 100 and a bending region 200 connected to the planar region 100. The display panel further includes a flexible substrate and a driver circuit layer 40, and the flexible substrate at least includes a first flexible layer 10, a barrier layer 20, and a second flexible layer 30.

In the embodiment, the groove 11 includes a first groove 111 and a second groove 112. The first groove 111 is disposed in the middle region 203, and the second groove 112 is disposed in the first bending region 201. The second groove may also be disposed in the second bending region 202.

Cross-sectional shapes of the grooves 11 may be trapezoidal, rectangular, semi-circular, or the like, or may be other shapes, and the cross-sectional shapes of the first groove 111 and the second groove 112 may be the same or different. It should be noted that the cross-sectional shapes of the grooves 11 are shapes of the first flexible layer 10 under an unbent state.

It should be noted that the number of the grooves 11 is not limited thereto, and the number of the grooves 11 in the bending region 200 may be more than the number of the grooves in other regions. The number of the grooves 11 may be more than one in the middle region 203 and the non-middle region. The shapes of the plurality of grooves 11 may be the same or different, and the plurality of grooves 11 may be disposed at equal intervals. Designers in the field can design the shape, size, spacing and other parameters of each groove 11 as required.

Figure 7:
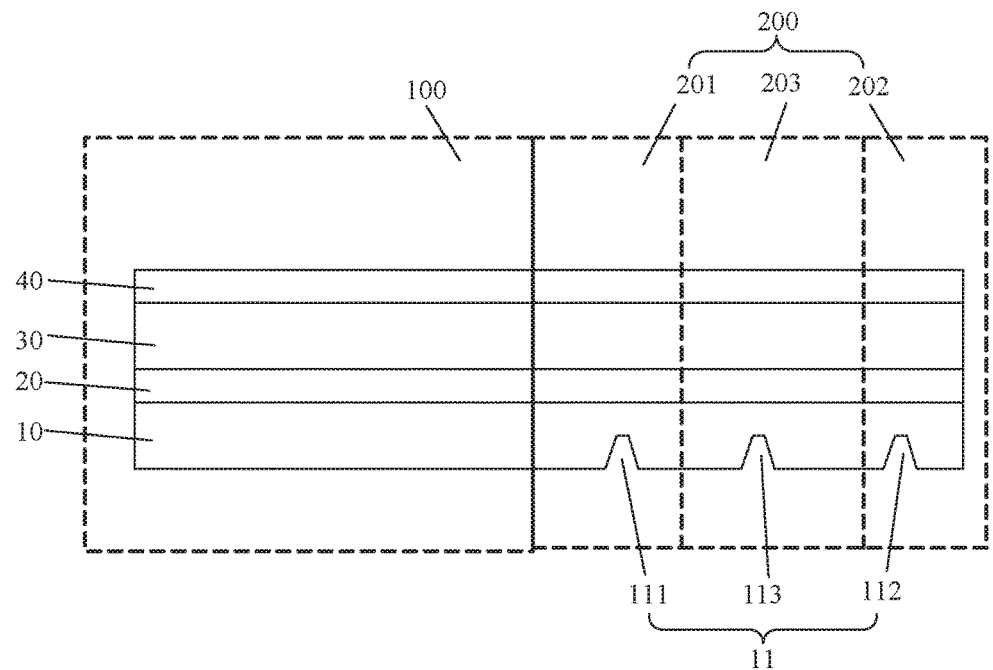
FIG. 7 is a schematic diagram of a sixth structure of a display panel according to an embodiment of the disclosure.

As shown in FIG. 7, a schematic diagram of a sixth structure of a display panel according to an embodiment of the disclosure is shown. The display panel includes a planar region 100 and a bending region 200 connected to the planar region 100. The display panel further includes a flexible substrate and a driver circuit layer 40, and the flexible substrate at least includes a first flexible layer 10, a barrier layer 20, and a second flexible layer 30.

In the present embodiment, the groove 11 includes a first groove 111, a second groove 112 and a third groove 113. The first groove 111 is disposed in the first bending region 201, the second groove 112 is disposed in the second bending region 202, and a third groove 113 is disposed in the middle region 203.

The cross-sectional shape of the groove 11 may be trapezoidal, rectangular, semi-circular, or the like, and may be other shapes. The cross-sectional shapes of the first groove 111, the second groove 112, and the third groove 113 may be the same or different. It should be noted that the cross-sectional shape of the groove 11 is a shape of the first flexible layer 10 under an unbent state.

It should be noted that the number of the grooves 11 is not limited thereto, and the number of the grooves 11 in the bending region 200 may be more than the number of the grooves in other regions. The number of the grooves 11 may be more than one in the middle region 203 and the non-middle region. The shapes of the plurality of grooves 11 may be the same or different, and the plurality of grooves 11 may be disposed at equal intervals. Designers in the field can design the shape, size, spacing and other parameters of each groove 11 as required.

In all of the above embodiments, the thickness of the first flexible layer 10 in the bending region 200 is reduced by disposing the groove 11 on the first flexible layer 10 in the bending region 200. By adjusting the shape, size, number, intervals and other parameters of the groove 11 in the bending region, the stress neutral layer in the bending region 200 is aligned with the metal trace when the display panel is subjected to different bending angles. The technical problems of stress concentration in the bending region 200 and metal trace breakage can be improved.

Figure 8:
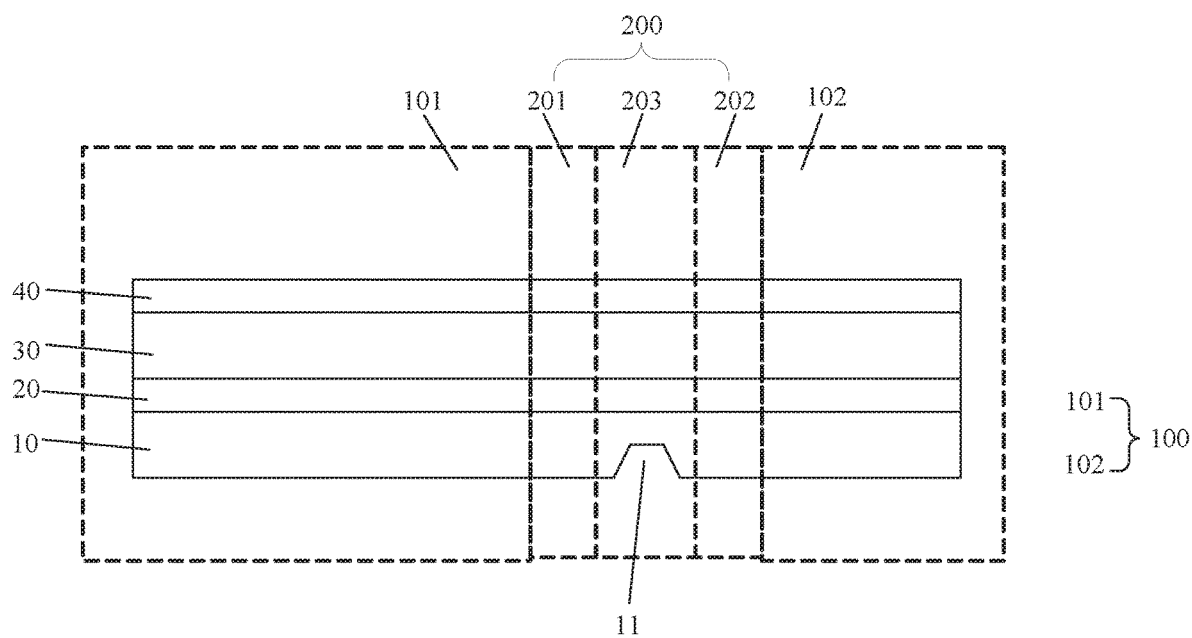
FIG. 8 is a schematic diagram of a seventh structure of a display panel according to an embodiment of the disclosure.

As shown in FIG. 8, a schematic diagram of a sixth structure of a display panel according to an embodiment of the disclosure is shown. The display panel includes a planar region 100 and a bending region 200 connected to the planar region 100. The display panel further includes a first flexible layer 10, a barrier layer 20, a second flexible layer 30, and a driver circuit layer 40.

In the present embodiment, the planar region 100 includes a first planar region 101, a second planar region 102, and a bending region 200 connecting the first planar region 101 and the second planar region 102.

The display panel in the embodiment of the present application may be a liquid crystal display panel or an OLED display panel. Generally, a non-display area of the display panel is bent to a back surface of a display area to realize a narrow frame design of the display panel. Besides, the display area corresponds to the first planar region 101, and the non-display area corresponds to the second planar region 102. After the display panel is bent, the screen is displayed only in the first planar region 101, and the second planar region 102 is bent to the back surface of the display panel and is connected to a driving chip (not shown).

The bending region 200 includes a non-middle region and an middle region 203. The non-middle region includes a first bending region 201 connecting the first planar region 101 and the middle region 203, and a second bending region 202 connecting the second planar region 102 and the middle region 203.

In the bending region 200, a groove 11 is disposed on a side of the first flexible layer 10 away from the barrier layer 20. There are various manners to dispose the groove 11.

In one embodiment, only one groove 11 is provided, and the groove 11 is disposed in any one of the first bending region 201, the second bending region 202 or the middle region 203.

In one embodiment, a plurality of grooves 11 are provided, the grooves 11 are disposed in at least one of the first bending region 201, the second bending region 202 or the middle region 203.

When a plurality of grooves 11 are provided, the plurality of grooves 11 may be disposed at equal intervals, and the shapes of the grooves 11 may be the same or different.

The arrangement and shape of the groove 11 are the same as those in the above embodiment. For details, refer to the embodiment in FIG. 1 to FIG. 7, and details are not described herein again.

By forming the groove 11 in the first flexible layer 10 in the bending region 200, a thickness of the first flexible layer 10 in the bending region 200 is reduced and then the stress neutral layer in the bending region 200 is aligned with the metal trace. The technical problems of stress concentration in the bending region and metal trace breakage can be improved.

Figure 9:
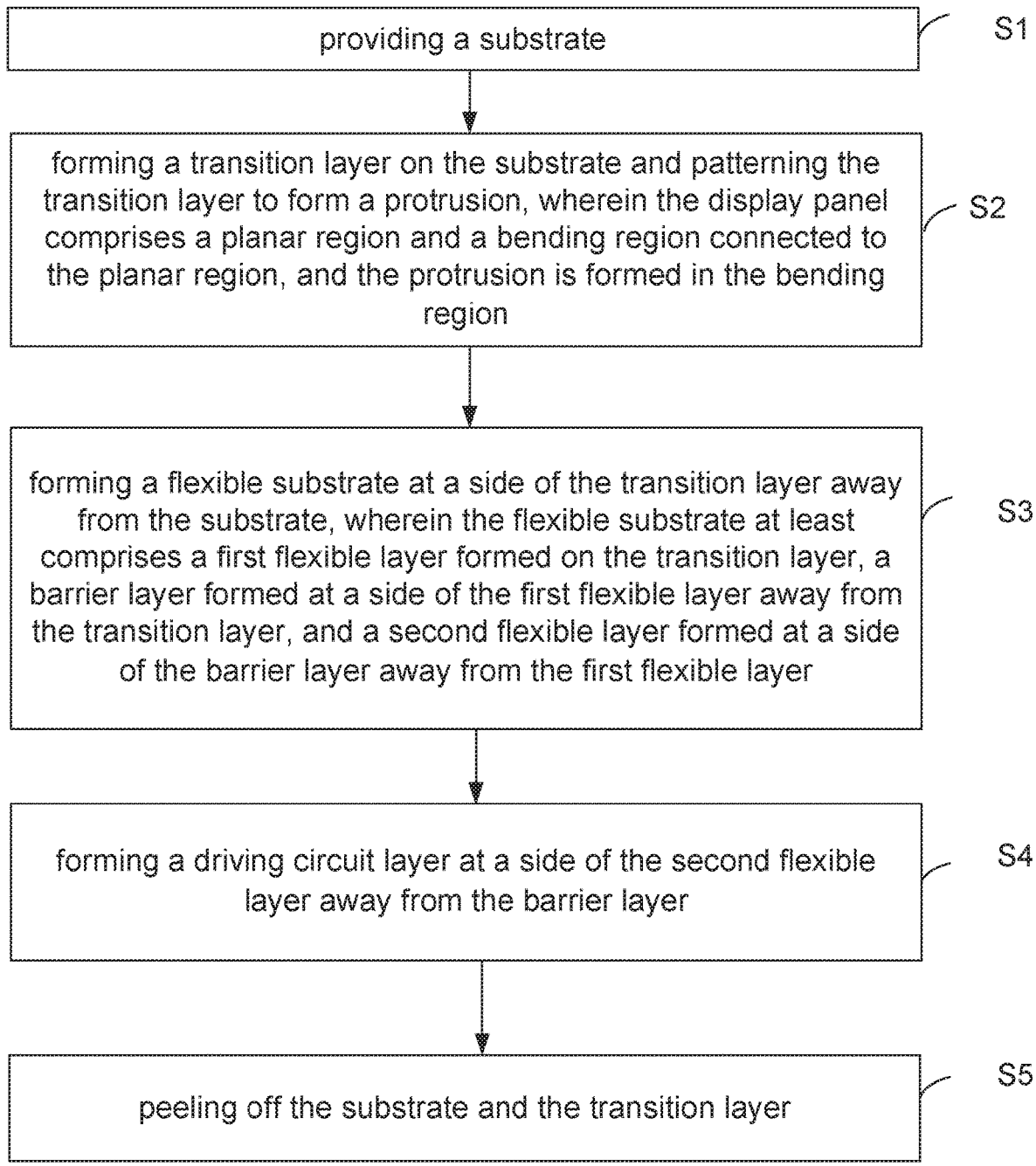
FIG. 9 is a flowchart of a method for manufacturing the display panel according to an embodiment of the disclosure.

Referring to FIG. 9, the disclosure further provides a method for manufacturing a display panel. The method comprises following steps.

In a step S1, a substrate is provided.

In a step S2, a transition layer is formed on the substrate and the transition layer is patterned to form a protrusion. The display panel comprises a planar region and a bending region connected to the planar region, and the protrusion is formed in the bending region.

In a step S3, a flexible substrate is formed at a side of the transition layer away from the substrate. The flexible substrate at least comprises a first flexible layer formed on the transition layer, a barrier layer formed at a side of the first flexible layer away from the transition layer, and a second flexible layer formed at a side of the barrier layer away from the first flexible layer.

In a step S4, a driving circuit layer is formed at a side of the second flexible layer away from the barrier layer.

In a step S5, the substrate and the transition layer are peeled off.

The method will be specifically described below with reference to FIG. 1 to FIG. 10.

Figure 10:
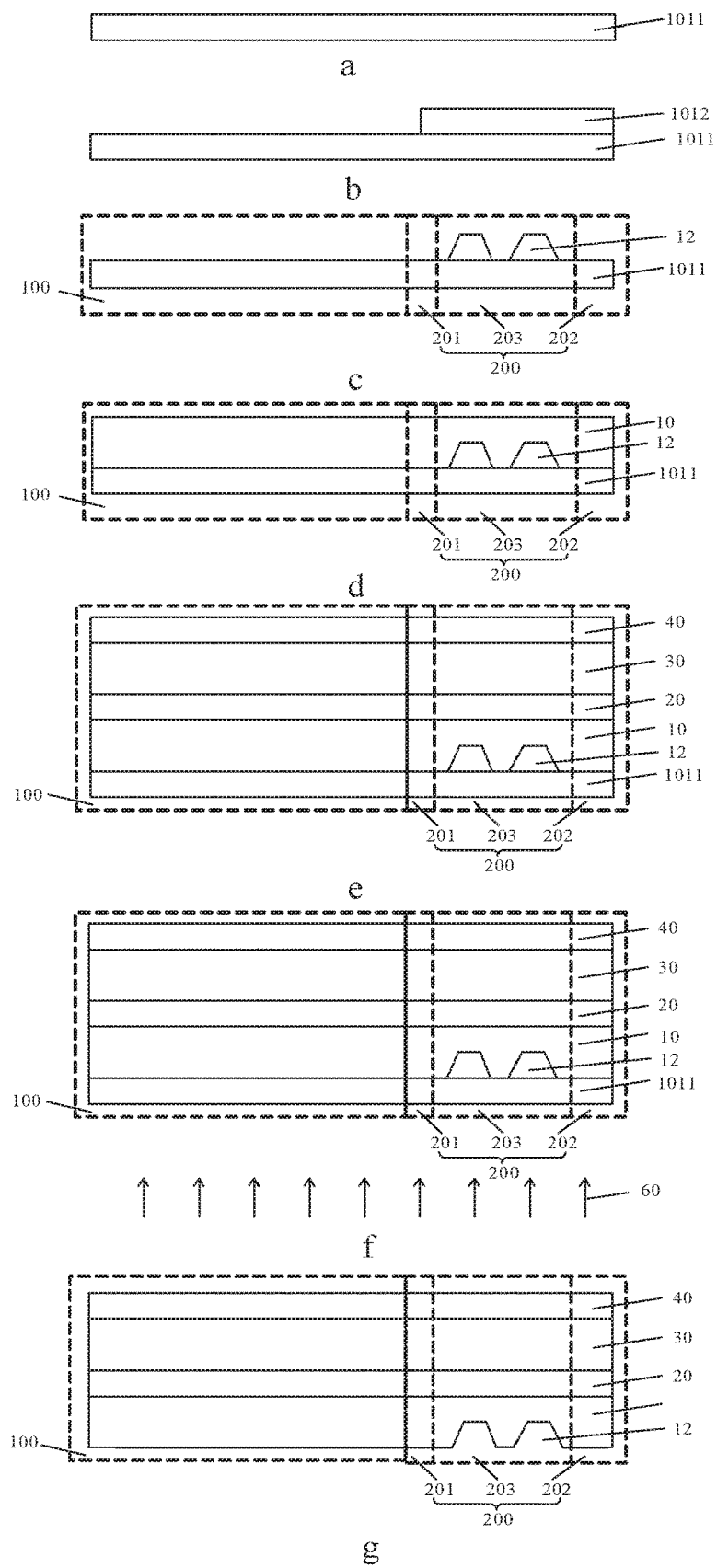
FIG. 10 is a schematic diagram of different stages of a method for manufacturing the display panel according to an embodiment of the disclosure.

In the step S1, a substrate 1011 is provided. As shown in FIG. 10, a material used for the substrate 1011 is one of a glass, a metal, and an organic film layer. Since a flexible material cannot be directly formed into a film, it needs to be prepared on a rigid material in advance, so it is necessary to provide a rigid base substrate 1011 first.

In the step S2, a transition layer 1012 is formed on the substrate 1011 and the transition layer is patterned to form a protrusion 12. The display panel comprises a planar region 100 and a bending region 200 connected to the planar region 100, and the protrusion 12 is formed in the bending region 200.

As shown in b of FIG. 10, a transparent polymer material is uniformly coated on the clean and smooth substrate 1011, and is heated to form the transition layer 1012.

In one embodiment, the transparent polymer material has a viscosity of from 1000 cps to 3000 cps and a thermal decomposition temperature of the transparent polymer material is greater than 450° C. during being heated. A film thickness of a coated wet film formed is 30 μm to 100 μm, a film formation temperature is between 200° C. to 400° C., and a film formation time is 0.1 hour to 1 hour.

As shown in c of FIG. 10, the transition layer 1012 is patterned to form the protrusion 12. In this embodiment, a patterning method is a dry etching process.

The display panel includes a planar region 100 and a bending region 200 connected to the planar region 100. The protrusion 12 is formed in the bending region 200 after being patterned.

In one embodiment, when the transition layer 1012 is coated, the transition layer is completely coated on the base substrate 1011, and then the protrusions 12 are formed only in the bending region 200 after the transition layer is patterned. The transition layers 1012 in other regions are etched.

In one embodiment, when the transition layer 1012 is coated, the transition layer is only coated within the bending region 200, and the patterned protrusion 12 is also formed within the bending region 200.

In the conventional technology, a non-display area of the display panel is generally bent to a back surface of a display area to realize a narrow frame design of the display panel. Besides, the display area corresponds to the planar region 100, and the non-display area corresponds to the bending region 200. A screen is displayed only in the planar region 100.

The bending region 200 includes a non-middle region and an middle region 203. The non-middle region includes a first bending region 201 connecting the planar region 100 and the middle region 203, and a second bending region 202 disposed at the other side of the middle region 203.

There are various manners to set a position of the protrusion 12 in the bending region 200. In the present embodiment, the number of the protrusion 12 is one and is formed in the middle region 203. A cross-sectional shape of the protrusion 12 may be trapezoidal, rectangular, semi-circular, or the like, and may be other shapes.

In one embodiment, the number of protrusions 12 is one and is formed in a non-middle region. The protrusions 12 may be formed in the first bending region 201 or may be formed in the second bending region 202. The cross-sectional shape of the protrusions 12 may be trapezoidal, rectangular, semi-circular, or the like, and may be other shapes.

In one embodiment, the protrusion 12 includes a first protrusion and a second protrusion (both not shown) and are both formed in the middle region 203. The cross-sectional shape of the protrusion 12 may be trapezoidal, rectangular, semi-circular, and the like, or may be other shapes, and the cross-sectional shapes of the first protrusion and the second protrusion may be the same or different.

In one embodiment, the protrusion 12 includes a first protrusion and a second protrusion (both not shown) and are both formed in a non-middle region. The cross-sectional shape of the protrusion 12 may be trapezoidal, rectangular, semi-circular, or the like, or may be other shapes. The cross-sectional shapes of the first protrusion and the second protrusion may be the same or different. It should be noted that the number of the protrusion 12 is not limited thereto. In the first bending region 201 or the second bending region 202, the number of the protrusion 12 may be more than one, and the shapes of the plurality of protrusions 12 may be the same or different. Alternatively, the plurality of protrusions 12 may be disposed at equal intervals. Designers in the field can design the shape, size, spacing and other parameters of each protrusion 12 as required.

In one embodiment, the protrusion 12 includes a first protrusion and a second protrusion (not shown). The first protrusion is formed in the middle region 203. The second protrusion is formed in the first bending region 201, and may also be formed in the second bending region 202. The cross-sectional shape of the protrusion 12 may be trapezoidal, rectangular, semi-circular, or the like, or may be other shapes, and the cross-sectional shapes of the first protrusion and the second protrusion may be the same or different. It should be noted that the number of the protrusion 12 is not limited thereto, and the number of the protrusion 12 in the bending region 200 may be more than the number of the protrusion in other region. The number of the protrusion 12 may be more than one in the middle region 203 and the non-middle region. The shapes of the plurality of protrusions 12 may be the same or different, and the plurality of protrusions 12 may be disposed at equal intervals. Designers in the field can design the shape, size, spacing and other parameters of each protrusion 12 as required.

In one embodiment, the protrusion 12 includes a first protrusion, a second protrusion, and a third protrusion (not shown). The first protrusion is formed in the first bending region 201, the second protrusion is formed in the second bending region 202, and the third protrusion is formed in the middle region 203.

The cross-sectional shape of the protrusion 12 may be trapezoidal, rectangular, semi-circular, or the like, or may be other shapes, and the cross-sectional shapes of the first protrusion, the second protrusion, and the third protrusion may be the same or different.

It should be noted that the number of the protrusion 12 is not limited thereto, and the number of the protrusion 12 in the bending region 200 may be more than the number of the protrusion in other region. The number of the protrusion 12 may be more than one in the middle region 203 and the non-middle region. The shapes of the plurality of protrusions 12 may be the same or different, and the plurality of protrusions 12 may be disposed at equal intervals. Designers in the field can design the shape, size, spacing and other parameters of each protrusion 12 as required.

In the step S3, a flexible substrate is formed at a side of the transition layer 1012 away from the substrate 1011. The flexible substrate at least comprises a first flexible layer 10 formed on the transition layer 1012, a barrier layer 20 formed at a side of the first flexible layer 10 away from the transition layer 1012, and a second flexible layer 30 formed at a side of the barrier layer 20 away from the first flexible layer 10.

As shown in d of FIG. 10, a polyamide acid solution is uniformly coated on the protrusion 12 formed by patterning of the transition layer 1012, and the substrate 1011 is also coated with the polyamide acid solution. Then, a heating process is preceded at a low temperature to form a film and the organic solvent is removed. Then, the film is heated and dehydrated in a high-purity nitrogen atmosphere, and a high-temperature thermal imidization reaction occurs to obtain a first flexible layer 10.

In one embodiment, a viscosity of the coated polyamide acid solution is 3000 cps to 7000 cps, a thermal decomposition temperature is higher than 450° C., a thickness of a coated wet film is 50 μm to 300 μm, and a heating temperature of the heating process at the low temperature for dehydration is between 20° C. to 80° C., and a heating time is in 1 min to 20 min. When the film is heated and dehydrated, a heating rate is 5° C./min to 20° C./min, a curing temperature is 350° C. to 550° C., and a curing time is 0.1 hour to 1 hour.

In the present embodiment, a thickness of the protrusion 12 is from one quarter to three quarters of a thickness of the first flexible layer 10.

As shown in e of FIG. 10, a barrier layer 20 and a second flexible layer 30 which are laminated are formed on a side of the first flexible layer 10 away from the transition layer 1012. An inorganic material is first deposited on the first flexible layer 10 to form a barrier layer 20. The inorganic material generally comprises a SiO2 structure or a stacked structure of SiO2 and SiNx, and the barrier layer 20 functions to block water and oxygen.

In one embodiment, the barrier layer 20 has a thickness of 100 nanometers to 600 nanometers.

Then, a second flexible layer 30 is formed on the barrier layer 20. First, the polyamide acid solution is uniformly coated on the barrier layer 20, and the first flexible layer 10 is also coated with the polyamide acid solution. Then, a low temperature heating process is preceded to form a film and the organic solvent is removed. Then, the film is heated and dehydrated in a high-purity nitrogen atmosphere, and a high-temperature thermal imidization reaction is preceded to obtain a second flexible layer 30.

In one embodiment, a viscosity of the coated polyamide acid solution is 3000 cps to 7000 cps, a thermal decomposition temperature is higher than 450° C., a thickness of a coated wet film is 50 μm to 300 μm, and a heating temperature of the heating process at the low temperature for dehydration is between 20° C. to 80° C., and a heating time is in 1 min to 20 min. When the film is heated and dehydrated, a heating rate is 5° C./min to 20° C./min, a curing temperature is 350° C. to 550° C., and a curing time is 0.1 hour to 1 hour.

It should be noted that the flexible substrate of the disclosure is not limited to the first flexible layer 10, the barrier layer 20, and the second flexible layer 30. The flexible substrate can be formed by coating a polyimide and depositing an inorganic material two or more times for forming more laminated layers of the flexible layers and the barrier layers. Those skilled in this field can design the number of layers of flexible substrates as needed.

In the step S3, as shown in e of FIG. 10, a driving circuit layer 40 is formed at a side of the second flexible layer 30 away from the barrier layer 20. The driving circuit layer 40 includes a thin film transistor, a metal trace, and the like.

Other film layers are also disposed on the drive circuit layer 40. The display panel in the embodiment of the disclosure may be a liquid crystal display panel or an OLED display panel.

When the display panel is an OLED display panel, in the first planar region 101, the display panel further comprises a planarization layer disposed on the driving circuit layer 40, a pixel defining layer and a pixel electrode formed on the planarization layer, a luminescent functional layer formed on the pixel defining layer and the pixel electrode, and a common electrode formed on luminescent functional layer (not shown).

When the display panel is a liquid crystal display panel, in the first planar region 101, the display panel further comprises a liquid crystal layer and a color filter substrate formed on the driving circuit layer 40.

In the step S5, the substrate 1011 and the transition layer 1012 are peeled off. Since the flexible material cannot be individually prepared, it needs to be prepared on the rigid substrate 1011. After all of the film layers are prepared, the rigid material is peeled off. Finally, a display panel comprising a flexible substrate in obtained and the display panel can be bent. Commonly, a peeling method is laser peeling.

As shown in f of FIG. 10, a laser light 60 is irradiated on one side of the substrate 1011 away from the first flexible layer 10. Since the protrusions 12 are formed in the bending region 200, the focal length and energy of the laser light 60 can be set differently in the bending region 200 and other regions. In the planar region 100, the laser light 60 passes through the substrate 1011 and acts on an interface between the substrate 1011 and the first flexible layer 10 to separate the substrate 1011 from the first flexible layer 10. Meanwhile, in the bending region 200, the laser light 60 passes through the substrate 1011 and the protrusions 12 and acts on an interface of the protrusions 12 and the first flexible layer 10. The substrate 1011 and the protrusions 12 are separated as a whole from the first flexible layer 10.

As shown in g of FIG. 10, in the display panel preformed the laser peeling, a groove 11 is formed at the side of the first flexible layer 10 away from the barrier layer 30, and the groove comprises a cross-sectional shape identical to that of the protrusion 12.

When the display panel is bent, metal traces (not shown) in the drive circuit layer 40 are bent together. In the bending region 200, the metal traces are stressed. If the stress neutral layer of the display panel is aligned with the metal traces, a length of the metal traces will remain constant, and no damage such as breakage will occur. A display effect of the display panel will not be affected.

However, in the conventional technology, it is generally occurs that the stress neutral layer in the bending region 200 is inconsistent with the metal trace, and the metal trace is subjected to excessive stress and damage.

In the above method, the first flexible layer 10 forms the groove 11 at a corresponding position in the bending region 200 by forming the transition layer 1012 into the protrusion 12 in the bending region 200. The thickness of the first flexible layer 10 in the bending region 200 is reduced. By adjusting the shape, size, number, intervals and other parameters of the protrusion 12 in the bending region, the shape, size, number, intervals and other parameters of the groove 11 in the bending region can be controlled. Thus, the stress neutral layer in the bending region 200 is aligned with the metal wiring region of the driving circuit layer 40 when the display panel is subjected to different bending angles. The technical problems of stress concentration in the bending region 200 and metal trace breakage can be improved.

The technical effects are as follows. The disclosure provides a display panel and a method for manufacturing the display panel. The display panel comprises a planar region and a bending region connected to the planar region. The display panel further comprises a flexible substrate and a driving circuit layer. The flexible substrate at least comprises a first flexible layer, a barrier layer disposed at a side of the first flexible layer, and a second flexible layer disposed at a side of the barrier layer away from the first flexible layer. The driving circuit layer disposed at a side of the second flexible layer away from the barrier layer. Beside, a groove is disposed at a side of the first flexible layer away from the barrier layer in the bending region. By disposing the groove on the first flexible layer in the bending region, a thickness of the first flexible layer in the bending region is reduced, and then the stress neutral layer in the bending region gradually corresponds to the metal wiring region of the driving circuit layer. Therefore, the technical problem that metal wiring regions of a stress neutral layer and a driving circuit layer are often not corresponding with each other in a bending region in a conventional display panel can be improved.

This disclosure has been described with preferred embodiments thereof, and it is understood that many changes and modifications to the described embodiment can be carried out without departing from the scope and the spirit of the invention.

What is claimed is:

1. A display panel, comprising:
    a planar region and a bending region connected to the planar region; and
    a flexible substrate and a driving circuit layer;
    wherein the flexible substrate at least comprises:
       a first flexible layer;
       a barrier layer disposed at a side of the first flexible layer;
       a second flexible layer disposed at a side of the barrier layer away from the first flexible layer;
    the driving circuit layer disposed at a side of the second flexible layer away from the barrier layer; and
    wherein at least one groove is disposed at a side of the first flexible layer away from the barrier layer in the bending region, and a thickness of the groove is from one quarter to three quarters of a thickness of the first flexible layer.

2. The display panel according to claim 1, wherein a cross-sectional shape of the groove is one of a trapezoidal shape, a semi-circular shape, or a rectangular shape.

3. The display panel according to claim 1, wherein a number of the groove is more than one, and the grooves are equally spaced between each other.

4. The display panel according to claim 1, wherein a number of the groove is more than one, and shapes of the grooves are same.

5. The display panel according to claim 1, wherein a number of the groove is more than one, and shapes of the grooves are different.

6. The display panel according to claim 1, wherein the groove is disposed at a middle region of the bending region.

7. The display panel according to claim 1, wherein the groove is disposed at a non-middle region of the bending region.

8. The display panel according to claim 1, wherein a number of the groove is more than one, and the grooves are disposed at a middle region and a non-middle region of the bending region.

9. A method for manufacturing a display panel, comprising:
    providing a substrate;
    forming a transition layer on the substrate and patterning the transition layer to form a protrusion, wherein the display panel comprises a planar region and a bending region connected to the planar region, and the protrusion is formed in the bending region;
    forming a flexible substrate at a side of the transition layer away from the substrate, wherein the flexible substrate at least comprises a first flexible layer formed on the transition layer, a barrier layer formed at a side of the first flexible layer away from the transition layer, and a second flexible layer formed at a side of the barrier layer away from the first flexible layer;
    forming a driving circuit layer at a side of the second flexible layer away from the barrier layer; and
    peeling off the substrate and the transition layer.

10. The method for manufacturing the display panel according to claim 9, wherein the step of forming the transition layer on the substrate and patterning the transition layer to form the protrusion, wherein the display panel comprises the planar region and the bending region connected to the planar region, and the protrusion is formed in the bending region further comprises:
    coating a transparent polymer material on the substrate to form the transition layer; and
    etching the transition layer to form the protrusion in the bending region.

11. The method for manufacturing the display panel according to claim 10, wherein the step of etching the transition layer to form the protrusion in the bending region further comprises: etching the transition layer to form the protrusion having a cross-sectional shape of one of a trapezoidal shape, a semicircular shape, or a rectangular shape.

12. The method for manufacturing the display panel according to claim 10, wherein the step of etching the transition layer to form the protrusion in the bending region further comprises: etching the transition layer to form one or more protrusions.

13. The method for manufacturing the display panel according to claim 12, wherein the step of etching the transition layer to form one or more protrusions further comprises: etching the transition layer to form a plurality of protrusions disposed at equal intervals on the transition layer.

14. The method for manufacturing the display panel according to claim 12, wherein the step of etching the transition layer to form one or more protrusions further comprises: etching the transition layer to form a plurality of protrusions having the same shape.

15. The method for manufacturing the display panel according to claim 12, wherein the step of etching the transition layer to form one or more protrusions further comprises: etching the transition layer to form a plurality of protrusions having different shapes.

16. The method for manufacturing the display panel according to claim 9, wherein the step of forming the flexible substrate at a side of the transition layer away from the substrate, wherein the flexible substrate at least comprises the first flexible layer formed on the transition layer, the barrier layer formed at a side of the first flexible layer away from the transition layer, and the second flexible layer formed at a side of the barrier layer away from the first flexible layer further comprises: forming the first flexible layer on the transition layer, and a height of the protrusion is from one quarter to three quarters of a thickness of the first flexible layer.

17. The method for manufacturing the display panel according to claim 9, wherein the step of forming the transition layer on the substrate and patterning the transition layer to form the protrusion, wherein the display panel comprises the planar region and the bending region connected to the planar region, and the protrusion is formed in the bending region further comprises: forming the protrusion in an middle region of the bending region.

18. The method for manufacturing the display panel according to claim 9, wherein the step of forming the transition layer on the substrate and patterning the transition layer to form the protrusion, wherein the display panel comprises the planar region and the bending region connected to the planar region, and the protrusion is formed in the bending region further comprises: forming the protrusion in a non-middle region of the bending region.

* * * * *